United States Patent
Robin

(10) Patent No.: US 10,276,745 B2
(45) Date of Patent: Apr. 30, 2019

(54) LIGHT EMITTING DIODE INCLUDING WAVELENGTH CONVERSION LAYERS

(71) Applicants: COMMISSARIAT A L'ENERGIE ATOMIQUE ET AUX ENERGIES ALTERNATIVES, Paris (FR); THALES, Courbevoie (FR)

(72) Inventor: Ivan-Christophe Robin, Grenoble (FR)

(73) Assignees: COMMISSARIAT A L'ENERGIE ATOMIQUE ET AUX ENERGIES ALTERNATIVES, Paris (FR); THALES, Courbevoie (FR)

( * ) Notice: Subject to any disclaimer, the term of this patent is extended or adjusted under 35 U.S.C. 154(b) by 0 days.

(21) Appl. No.: 15/962,584

(22) Filed: Apr. 25, 2018

(65) Prior Publication Data

US 2018/0323339 A1    Nov. 8, 2018

(30) Foreign Application Priority Data

May 2, 2017    (FR) ..................... 17 53842

(51) Int. Cl.
*H01L 33/06* (2010.01)
*H01L 33/32* (2010.01)
(Continued)

(52) U.S. Cl.
CPC .......... *H01L 33/06* (2013.01); *H01L 33/0025* (2013.01); *H01L 33/0075* (2013.01);
(Continued)

(58) Field of Classification Search
CPC ..... H01L 33/06; H01L 33/0025; H01L 33/04; H01L 33/075; H01L 33/08; H01L 33/32
(Continued)

(56) References Cited

U.S. PATENT DOCUMENTS

| 6,455,870 B1 * | 9/2002 | Wang ..................... B82Y 20/00 257/103 |
| 8,124,990 B2 * | 2/2012 | Kim ........................ H01L 33/06 257/13 |

(Continued)

FOREIGN PATENT DOCUMENTS

WO    WO 2014/154690 A1    10/2014

OTHER PUBLICATIONS

French Preliminary Search Report dated Jan. 18, 2018 in French Application 17 53842 filed on May 2, 2017 (with English Translation of Categories of Cited Documents).
(Continued)

*Primary Examiner* — Dao H Nguyen
(74) *Attorney, Agent, or Firm* — Oblon, McClelland, Maier & Neustadt, L.L.P.

(57) ABSTRACT

A light emitting diode including:
a structure for emitting light at a first wavelength $\lambda_1$, comprising a p-n junction in which is arranged an active zone including a first emissive layer comprising $In_{X1}Ga_{1-X1}N$ arranged between two first barriers;
a conversion structure configured for converting the light emitted by the emission structure into a second wavelength different to the first, arranged on the emission structure and including a second $In_{X2}Ga_{1-X2}N$ emissive layer, arranged between two second barriers each including several $In_{X3}Ga_{1-X3}N$ absorption layers separated from each other by a GaN interlayer;
in which the indium concentrations $X_1$, $X_2$ and $X_3$ are such that $0<X_1<X_2$ and $Eg(In_{X2}Ga_{1-X2}N)<Eg(In_{X3}Ga_{1-X3}N)\leq h\cdot c/\lambda_1$.

13 Claims, 2 Drawing Sheets

(51) Int. Cl.
  *H01L 29/06* (2006.01)
  *H01L 33/00* (2010.01)
  *H01L 33/08* (2010.01)
  *H01L 33/04* (2010.01)

(52) U.S. Cl.
  CPC .............. *H01L 33/08* (2013.01); *H01L 33/32* (2013.01); *H01L 33/04* (2013.01)

(58) Field of Classification Search
  USPC .. 257/13, 14, 17, 96, 97, 99, 190, 191, 503, 257/E33.005, E33.008, E33.027, E33.048, 257/E29.005, E29.078, E29.081, E29.091, 257/E29.168; 372/45.01, 45.012; 438/22, 45, 46, 47, 478
  See application file for complete search history.

(56) References Cited

U.S. PATENT DOCUMENTS

| | | | |
|---|---|---|---|
| 8,163,581 B1* | 4/2012 | Or-Bach | H01L 31/0725 438/39 |
| 2004/0090779 A1* | 5/2004 | Ou | H01L 33/08 362/231 |
| 2004/0227144 A1 | 11/2004 | Hon | |
| 2006/0054905 A1 | 3/2006 | Schwach et al. | |
| 2006/0124917 A1* | 6/2006 | Miller | H01L 33/08 257/13 |
| 2006/0246612 A1* | 11/2006 | Emerson | H01L 33/24 438/22 |
| 2007/0051967 A1 | 3/2007 | Miller et al. | |
| 2008/0025360 A1* | 1/2008 | Eichler | B82Y 20/00 372/45.012 |
| 2008/0272362 A1 | 11/2008 | Miller et al. | |
| 2008/0272387 A1 | 11/2008 | Miller et al. | |
| 2009/0101934 A1 | 4/2009 | Massies et al. | |
| 2009/0166668 A1* | 7/2009 | Shakuda | B82Y 20/00 257/103 |
| 2010/0090232 A1 | 4/2010 | Huang et al. | |
| 2010/0155694 A1 | 6/2010 | Miller et al. | |
| 2010/0294957 A1 | 11/2010 | Albrecht et al. | |
| 2011/0045623 A1 | 2/2011 | Massies et al. | |
| 2012/0190141 A1 | 7/2012 | Huang et al. | |
| 2013/0049569 A1 | 2/2013 | Schubert et al. | |
| 2013/0050810 A1 | 2/2013 | Schubert et al. | |
| 2016/0043272 A1* | 2/2016 | Damilano | H01L 33/0075 257/13 |
| 2016/0211423 A1 | 7/2016 | Schubert et al. | |
| 2017/0084697 A1* | 3/2017 | Bavard | H01L 21/02381 |

OTHER PUBLICATIONS

U.S. Appl. No. 14/779,516, filed Sep. 23, 2015, 2016/0049544 A1, Robin, I. et al.

U.S. Appl. No. 14/913,254, filed Feb. 19, 2016, 2016/0204307 A1, Robin, I. et al.

U.S. Appl. No. 14/031,992, filed Apr. 25, 2016, 2016/0276328 A1, Robin, I. et al.

U.S. Appl. No. 14/031,963, filed Apr. 25, 2016, 2016/0270176 A1, Robin, I. et al.

* cited by examiner

LIGHT EMITTING DIODE INCLUDING WAVELENGTH CONVERSION LAYERS

TECHNICAL FIELD AND PRIOR ART

The invention relates to the field of light emitting diodes (known as LED) including one or more quantum wells, as well as that of display devices including such LEDs. The invention may advantageously relate to an LED configured for emitting green and/or red light.

To produce an LED emitting green colour light, which corresponds to a light emission between around 500 nm and 580 nm, or for example of the order of 525 nm or 530 nm, it is known to form quantum wells with InGaN emissive layers each arranged between two GaN barrier layers.

Such an LED is however not very efficient due to the fact that the degradation of the quality of the InGaN produced when the quantity of indium increases in the emissive layers (on account of the increase in the difference in lattice parameter between InGaN and GaN when the proportion of indium in the emissive layers increases).

One way of surmounting this problem is to use an LED comprising a first part forming an emission structure configured for emitting a blue colour light, for example at a wavelength between around 440 nm and 450 nm, coupled to a second part forming a structure for wavelength conversion of the light emitted by the emission structure, and comprising conversion layers that covert the blue light into green light. Such an emission structure emitting blue light may be produced from quantum wells in which the emissive layers comprise InGaN with a level, or concentration, of indium of the order of 16%, and in which the barrier layers comprise GaN. The conversion layers may also comprise quantum wells.

This approach is particularly interesting in the case of direct emission display devices because they potentially make it possible to convert blue light over small thicknesses. For example, in the case of a micro-screen provided with pixels produced with a pitch of the order of 10 μm, the conversion of blue light into green light is carried out over a thickness of the order of 10 μm.

To produce such conversion layers, it is possible to use GaN/InGaN quantum wells. However, such conversion layers are faced with two problems:

Firstly, within the conversion structure, the absorption of the blue light emitted by the emission structure is carried out only in the InGaN emissive layers. Due to the fact that these emissive layers have a low thickness, the blue light is weakly absorbed. On account of this low absorption of the light received by the conversion layers, to convert at least 80% of the incident blue light emitted by the LED and received by the conversion layers, it is necessary to use at least 20 InGaN quantum wells each having a thickness of around 3 nm. With such a number of quantum wells, the quality of the InGaN can degrade, as in the thick InGaN layers. Furthermore, this high number of confined levels widens the emission wavelength band and also induces problems of reabsorption of light, emitted from a first well, by a second well next to the first.

Furthermore, to emit green light of wavelength of the order of 525 nm, the level, or the concentration, of indium in the InGaN emissive layers of the conversion structure is equal to around 25%. With such a concentration, a strong difference in lattice parameter exists between the InGaN of the emissive layers and the GaN of the barrier layers on which the emissive layers are produced. The emissive layers produced are thus of very poor quality.

Thus, with such GaN/InGaN quantum wells, the conversion layers are inefficient, the conversion efficiencies (ratio of the number of photons absorbed over the number of photons re-emitted at the desired wavelength) obtained being less than 20%.

Similar problems are posed for the production of a red LED, which corresponds to a light emission between around 590 nm and 800 nm, including conversion layers with GaN/InGaN quantum wells intended to convert blue light into red light, due to the fact that the indium concentrations in the InGaN emissive layers must in this case be of the order of 30%, or even 40%.

DESCRIPTION OF THE INVENTION

Thus there is a need to propose a light emitting diode configured for emitting green or red colour light having good conversion efficiency.

To do so, one embodiment proposes a light emitting diode including at least:

a structure for emitting light at at least one first wavelength $\lambda_1$, comprising a p-n junction in which is arranged an active zone including at least one first quantum well formed by a first emissive layer comprising $In_{X1}Ga_{1-X1}N$ arranged between two first barriers;

a conversion structure configured for converting the light intended to be emitted by the emission structure into at least one second wavelength $\lambda_2$ different to the first wavelength $\lambda_1$, arranged on the emission structure and including at least one second quantum well formed by a second $In_{X2}Ga_{1-X2}N$ emissive layer, arranged between two second barriers each including several first $In_{X3}Ga_{1-X3}N$ absorption layers separated from each other by at least one first GaN interlayer;

in which the indium concentrations $X_1$, $X_2$ and $X_3$ are such that $0 < X_1 < X_2$ and $Eg(In_{X2}Ga_{1-X2}N) < Eg(In_{X3}Ga_{1-X3}N) \leq h \cdot c/\lambda_1$, with:

Eg corresponding to the gap, or to the forbidden energy gap;

h corresponding to the Planck's constant equal to around $6.63 \cdot 10^{-34}$ J·s;

c corresponding to the speed of light, equal to around 299,792,458 m/s.

In this LED, the conversion structure comprises quantum wells in which the absorption of the light emitted by the emission structure is carried out not only by the second emissive layer or layers, but also by the absorption layers of the second barriers which comprise InGaN with an indium composition equal to $X_3$. The production of such thick second barriers with a relatively high indium composition is possible thanks to the presence of the first GaN interlayers which make it possible to obtain a good total thickness of InGaN without degrading the quality of this semiconductor because during a production of the second barriers by epitaxy, these first interlayers perform a "re-initialisation" of the lattice parameter of the material to grow, enabling the successive production of several InGaN absorption layers without degradation of the quality of the semiconductor. An InGaN layer without GaN interlayer and having a thickness equivalent to the thickness of the first absorption layers located on one side of the second emissive layer would have a much lower quality than that of these first absorption layers.

For example, by carrying out the growth of a single layer of $In_{0.14}Ga_{0.86}N$ of thickness equal to 14 nm on GaN, the quality of the InGaN produced is poor because with such an indium concentration, this thickness is too high to obtain InGaN of good quality which would make it possible to achieve good light absorption. On the other hand, by carrying out the growth of a first $In_{0.14}Ga_{0.86}N$ layer of thickness equal to 7 nm on GaN, then the production of a GaN interlayer of several atomic monolayers on this first $In_{0.14}Ga_{0.86}N$ layer, and finally the growth of a second $In_{0.14}Ga_{0.86}N$ layer of thickness equal to 7 nm on the GaN interlayer, the quality of the semiconductor of this second $In_{0.14}Ga_{0.86}N$ layer is of good quality equivalent to that of the first $In_{0.14}Ga_{0.86}N$ layer, due to the fact that the seven nanometres of $In_{0.14}Ga_{0.86}N$ of the second layer are formed on GaN, unlike the seven final nanometres of the single $In_{0.14}Ga_{0.86}N$ layer of thickness equal to 14 nm which are formed on the seven first nanometres of this same layer.

Moreover, the low value of the indium concentration $X_3$ of the first absorption layers is a function of the indium concentration $X_1$ in the first emissive layer as well as the thickness of the first quantum well or wells of the emission structure. The lower the indium concentration $X_1$ and the thinner the first quantum well or wells of the emission structure, the lower the value of the first wavelength $\lambda_1$, which makes it possible to have an indium concentration $X_3$ in the first absorption layers which is also low.

It is possible to have indium concentrations $X_1$ and $X_3$ such that $X_1<X_3$, which makes it possible to improve light absorption by the first absorption layers. Indeed, it is possible to have an emission energy slightly greater than the energy of the gap $Eg(In_{X1}Ga_{1-X1}N)$, that is to say to have $h\cdot c/\lambda_1 > Eg(In_{X1}Ga_{1-X1}N)$. This is due to quantum confinement because emission in the emission structure takes place at an energy slightly greater than $Eg(In_{X1}Ga_{1-X1}N)$. The energy $h\cdot c/\lambda_1$ is all the greater than $Eg(In_{X1}Ga_{1-X1}N)$ the thinner the wells in the emission structure.

However, it is possible to have indium concentrations $X_1$ and $X_3$ such that $X_3<X_1$ due to the fact of quantum confinement in wells of composition $X_1$ in the emitting structure. This is advantageous in order not to have to grow absorption layers with a too high composition $X_3$. For example, advantageously, it is possible to have $X_1=0.15$ and $X_3=0.14$ if the wells in the emitting structure have a thickness less than around 2 nm.

When the first wavelength $\lambda_1$ corresponds to that of blue light, for example between around 440 nm and 500 nm, it is possible that the indium concentration $X_3$ is such that $0.14 \leq X_3$.

With such second barriers, the total thickness of the conversion structure may thus be greater than or equal to around 40 nm without having to produce a large number of quantum wells, which allows the conversion structure to achieve good absorption of the light emitted by the emission structure, and thus to have good conversion efficiency. Indeed, thanks to the absorption carried out by the absorption layers, the conversion efficiency is not limited by the transfer of charges to the second quantum well or wells of the conversion structure and depends on the parameters used for the properties of the materials in terms of Shockley Read Hall (SRH) and Auger recombination rate.

The total thickness of the conversion structure, that is to say the total thickness of the second quantum well or wells, may be greater than or equal to around 60 nm, which enables better light absorption to be obtained by the conversion structure. Advantageously, this thickness may be greater than or equal to around 100 nm, or even 200 nm.

The emission structure may comprise one or more first quantum wells.

The conversion structure may comprise a number of second quantum wells between 1 and 50. Thus, reabsorptions of light converted by the other quantum wells are avoided.

In having the condition $X_1<X_2$, this means that the gap of $In_{X2}Ga_{1-X2}N$, noted $Eg(In_{X2}Ga_{1-X2}N)$, is less than that of $In_{X1}Ga_{1-X1}N$, noted $Eg(In_{X1}Ga_{1-X1}N)$.

The first wavelength is for example between around 440 nm and 500 nm (spectrum corresponding to blue light), and the second wavelength is for example between around 500 nm and 580 nm (spectrum corresponding to green light) or between around 590 nm and 800 nm (spectrum corresponding to red light).

Each of the first barriers may comprise a GaN layer.

The indium concentration $X_1$ may be between around 0.09 and 0.18, and for example equal to around 0.15, and/or the indium concentration $X_2$ may be such that $X_2 \geq 0.22$, and/or the indium concentration $X_3$ may be such that $0.08 \leq X_3 \leq 0.22$ or advantageously $0.14 \leq X_3 \leq 0.18$. Advantageously, to obtain a conversion into green light, the indium concentration $X_2$ may be between around 0.22 and 0.25, and for example equal to around 0.25 to obtain a conversion into a second wavelength of around 530 nm. To obtain a conversion into red light, the indium concentration $X_2$ may be between around 0.3 and 0.4, and for example equal to around 0.35 to obtain a conversion into a second wavelength of around 620 nm.

Each first absorption layer which is not arranged against the second emissive layer may have a thickness less than 9 nm, and/or the total thickness of the second emissive layer and of two first absorption layers arranged against the second emissive layer may be less than 9 nm. Thus, within the conversion structure, InGaN is not produced in a continuous manner over a thickness greater than 9 nm, which makes it possible to avoid any degradation of said InGaN.

Each first GaN interlayer may have a thickness between 1 and 4 atomic monolayers, and advantageously between 1 and 2 atomic monolayers.

Each of the second barriers may comprise two first absorption layers and a first interlayer.

The conversion structure may comprise at least one third quantum well formed by a third $In_{X4}Ga_{1-X4}N$ emissive layer, arranged between two third barriers each including several second $In_{X5}Ga_{1-X5}N$ absorption layers separated from each other by at least one second GaN interlayer, in which the indium concentrations $X_4$ and $X_5$ are such that $X_1<X_4$ and $Eg(In_{X4}Ga_{1-X4}N)<Eg(In_{X5}Ga_{1-X5}N)$ $h\cdot c/\lambda_1$, with $X_2$ of value different to that of $X_4$. Such a conversion structure may thus be polychromatic, that is to say configured for converting the light emitted by the emission structure into at least two different wavelengths or two different wavelength ranges.

The indium concentration $X_2$ may be between 0.22 and 0.25, and the indium concentration $X_4$ may be between 0.3 and 0.4.

Another embodiment concerns a method for producing at least one light emitting diode, including at least:
  production of a structure for emitting light at at least one first wavelength $\lambda_1$, comprising a p-n junction in which is arranged an active zone including at least one first quantum well formed by a first emissive layer comprising $In_{X1}Ga_{1-X1}N$ arranged between two first barriers;

production of a conversion structure configured for converting the light intended to be emitted by the emission structure into at least one second wavelength $\lambda_2$ different to the first wavelength $\lambda_1$, arranged on the emission structure and including at least one second quantum well formed by a second $In_{X2}Ga_{1-X2}N$ emissive layer, arranged between two second barriers each including several first $In_{X3}Ga_{1-X3}N$ absorption layers separated from each other by at least one first GaN interlayer;

in which the indium concentrations $X_1$, $X_2$ and $X_3$ are such that $0 < X_1 < X_2$ and $Eg(In_{X2}Ga_{1-X2}N) < Eg(In_{X3}Ga_{1-X3}N) \leq h \cdot c / \lambda_1$, with:

Eg corresponding to the gap, or to the forbidden energy gap;

h corresponding to the Planck's constant equal to around $6.63 \cdot 10^{-34}$ J·s;

c corresponding to the speed of light, equal to around 299,792,458 m/s.

The layers of the emission structure and of the conversion structure may be produced by epitaxy.

BRIEF DESCRIPTION OF THE DRAWINGS

The present invention will be better understood on reading the description of exemplary embodiments given for purely indicative purposes and in no way limiting and by referring to the appended drawings in which.

Identical, similar or equivalent parts of the different figures described hereafter bear the same numerical references so as to make it easier to go from one figure to the next.

The different parts shown in the figures are not necessarily according to a uniform scale in order to make the figures more legible.

The different possibilities (alternatives and embodiments) should be understood as not being mutually exclusive and may be combined together.

DETAILED DESCRIPTION OF PARTICULAR EMBODIMENTS

Figure 1:
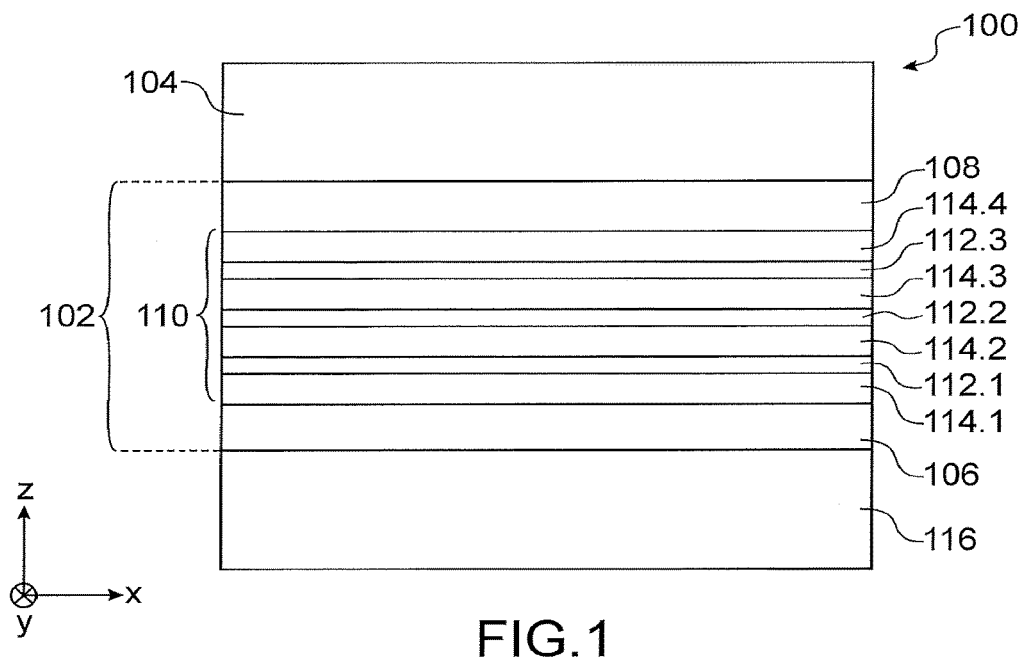
FIG. 1 shows a light emitting diode according to one particular embodiment.

Reference is firstly made to FIG. 1 which shows a light emitting diode, or LED, 100 according to one particular embodiment.

In the notation $In_XGa_{1-X}N$ used in the present document, X represents the indium composition, or indium concentration, of the semiconductor material, that is to say the proportion of indium with respect to the total quantity of indium and gallium in the $In_XGa_{1-X}N$. Moreover, the characteristic $Eg(In_XGa_{1-X}N)$ corresponds to the gap, or forbidden band gap, of the $In_XGa_{1-X}N$ semiconductor.

The LED 100 is formed of two parts: a first part forming an emission structure 102 configured for emitting light including at least one first wavelength $\lambda_1$, or a first range of wavelengths, and a second part forming a conversion structure 104 arranged on the emission structure 102 and configured for converting the light emitted by the emission structure 102 into a light including at least one second wavelength $\lambda_2$ different to the first wavelength, or a second range of wavelengths different to the first range of wavelengths.

The emission structure 102 corresponds to a conventional LED structure, and comprises a p-n junction formed by a first layer 106 including n-doped GaN (n-GaN) with a concentration of donors for example equal to around $10^{19}$ donors/cm$^3$ and a second layer 108 including p-doped GaN (p-GaN) with a concentration of acceptors for example equal to around $10^{19}$ acceptors/cm$^3$. These two layers 106 and 108 each have for example a thickness (dimension along the Z axis shown in FIG. 1) between around 20 nm and 10 μm. Generally speaking, the first layer 106 may have a concentration of donors between around $10^{17}$ and $10^{20}$ donors/cm$^3$, and the second layer 108 may have a concentration of acceptors between around $10^{15}$ and $10^{20}$ acceptors/cm$^3$.

In an alternative, it is possible that the first layer 106 comprises n-InGaN, with an indium concentration for example between 0 and around 20%. Moreover, when the indium concentration in the InGaN of the first layer 106 is not zero, the second layer 108 may comprise p-InGaN. In this case, the indium concentration in the InGaN of the second layer 108 is advantageously less than the indium concentration in the InGaN of the first layer 106, and for example between around 0% and 15%.

The emission structure 102 comprises, between the layers 106 and 108, an active zone 110 formed of intrinsic semiconductor including at least one first quantum well formed by a first emissive layer 112 arranged between two first barriers 114. In the particular embodiment described here, the emission structure 102 comprises three first emissive layers 112, referenced 112.1, 112.2 and 112.3. Generally speaking, the emissive structure 102 may comprise n first emissive layers 112, with n an integer such that n≥1, and advantageously such that 3≤n≤6. Furthermore, the first emissive layers 112 comprise $In_{X1}Ga_{1-X1}N$. The semiconductor of the first emissive layers 112 is not intentionally doped (residual donor concentration for example such that $n_{nid}=10^{17}$ donors/cm$^3$). Finally, each of the first emissive layers 112 has a thickness for example equal to around 3 nm, or between 1 nm and 5 nm.

The indium level of the InGaN of the first emissive layers 112 may be different from one layer to the next, the emission structure 102 being in this case configured for emitting according to different wavelengths from one first emissive layer 112 to the next. But, advantageously, the indium concentrations in the InGaN of the first emissive layers 112 are similar from one first emissive layer to the next, the emission structure 102 being in this case configured for emitting monochromatic light. In all cases, the value of the indium concentration within the first emissive layer or layers 112 is chosen as a function of the wavelength or wavelengths intended to be emitted.

In the particular embodiment described here, the first emissive layers 112 comprise $In_{0.16}Ga_{0.84}N$ (that is to say including a proportion of 16% of indium for 84% of gallium), or more generally $In_{X1}Ga_{1-X1}N$ with $X_1$ between around 0.09 and 0.18. Such first emissive layers 112 enable the emission structure 102 to emit blue colour light.

The active zone 110 of the emission structure 102 also comprises first barriers 114 (four in number in the emission structure 102 shown in FIG. 1, and referenced 114.1, 114.2, 114.3 and 114.4) including for example GaN not intentionally doped (residual donor concentration for example such that $n_{nid}=10^{17}$ donors/cm$^3$), of thickness for example equal to around 8 nm. Two of the four first barriers 114 are each interposed between two consecutive first emissive layers 112, and the two other first barriers 114 are each interposed between one of the first emissive layers 112 and one of the layers 106 and 108. Thus, the first barrier 114.1 is arranged between the first layer 106 and the first emissive layer 112.1. The first barrier 114.2 is arranged between the first emissive layers 112.1 and 112.2. The first barrier 114.3 is arranged between the first emissive layers 112.2 and 112.3. The first barrier 114.4 is arranged between the first emissive layer 112.3 and the second layer 108. Each first emissive layer 112 and the two first barriers 114 between which is located this first emissive layer 112 form a first quantum well.

In an alternative, it is possible that the first barriers 114 do not comprise GaN but InGaN. In this case, the values of the indium concentrations of the semiconductor of the first barriers 114 are less than those of the semiconductor of the first emissive layers 112 and thus for example between around 0.01 and 0.1.

Generally speaking, the emission structure 102 which comprises n first emissive layers 112, with n an integer greater than or equal to 1, thus comprises n+1 first barriers 114. The active zone 110 is formed of the alternating stack of the n first emissive layers 112 and the n+1 first barriers 114. The layers 112 and 114 may have residual donor concentrations between around $10^{16}$ and $10^{20}$ donors/cm$^3$.

The layers of the active zone 110 are produced by epitaxy, for example MOCVD, on a thick GaN layer 116 forming the growth substrate.

In an alternative, the layer 116 may comprise InGaN. In this case, the emission structure 102 may advantageously correspond to a structure entirely formed of InGaN, that is to say in which the layers 116, 106, 112, 114 and 108 comprise InGaN.

In an alternative, a layer of p-doped AlGaN may be interposed between the layer 108 and the active zone 110. This AlGaN layer may comprise a concentration equal to around $10^{19}$ acceptors/cm$^3$, a concentration of aluminium between around 5% and 25%, and a thickness between around 5 nm and 100 nm. Such an AlGaN layer makes it possible to block a current of electrons leaking from the active zone to the p side of the junction, that is to say the second layer 108.

Figure 2:
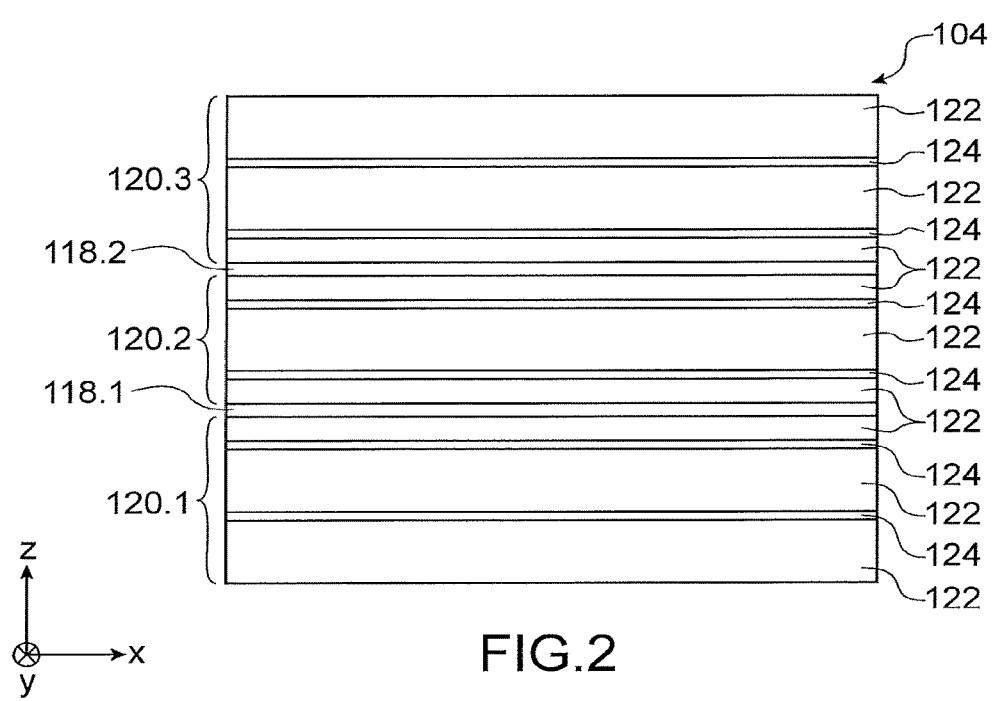
FIGS. 2 and 3 show exemplary embodiments of a conversion structure of a light emitting diode.

A first exemplary embodiment of the conversion structure 104 of the LED 100 is schematically shown in FIG. 2.

The conversion structure 104 comprises one or more second quantum wells which are intended to carry out a conversion of the first wavelength or wavelengths of the light emitted by the emission structure 102 into a light including a second wavelength or a second range of wavelengths, different to the first. Each of the second quantum wells is formed by a second emissive layer 118 arranged between two second barriers 120. In the first particular exemplary embodiment described here, the conversion structure 104 comprises two second emissive layers 118, referenced 118.1 and 118.2, each arranged between two second barriers 120, referenced 120.1, 120.2 and 120.3, thereby forming two second quantum wells. Generally speaking, the conversion structure 104 may comprise m second emissive layers 118, with m an integer such that m≥1, and advantageously such that 1≤m≤5.

The second barrier 120.1 is arranged between the emission structure 102 and the second emissive layer 118.1. The second barrier 120.2 is arranged between the second emissive layers 118.1 and 118.2. The second barrier 120.3 is arranged on the second emissive layer 118.2 and forms the face through which the light of which wavelength has been converted is intended to be emitted by the LED 100.

The second emissive layers 118 comprise $In_{x2}Ga_{1-x2}N$. In the first exemplary embodiment described here, the indium concentration $X_2$ of the InGaN of the second emissive layers 118 is greater than around 22%, here equal to around 25%. Thus, the light emitted by the emission structure 102 is converted into green light.

The semiconductor of the second emissive layers 118 is not intentionally doped (residual donor concentration for example such that $n_{nid}=10^{17}$ donors/cm$^3$). Finally, each of the second emissive layers 118 has a thickness for example between around 1 nm and 5 nm.

Unlike the first barriers 114 which are each formed by a single layer of material, each of the second barriers 120 is formed by a stack of several layers of distinct materials. Each of the second barriers 120 comprises several $In_{x3}Ga_{1-x3}N$ absorption layers 122 separated from each other by at least one GaN interlayer 124. In the exemplary embodiment of FIG. 2, each of the second barriers 120 comprises three absorption layers 122 separated from each other by two interlayers 124. The indium concentration $X_3$ of the InGaN of the absorption layers 122 is such that $Eg(In_{x2}Ga_{1-x2}N)$ <$Eg(In_{x3}Ga_{1-x3}N)$≤h·c/λ$_1$. In the case of an emission structure 102 emitting blue light, the indium concentration $X_3$ of the InGaN of the absorption layers 122 may be such that $0.14≤X_3≤X_2$.

Unlike GaN barrier layers such as for example those used in the emission structure 102, the second barriers 120 comprise InGaN with an indium concentration lower than that of the InGaN of the second emissive layers 118. The InGaN of the second barriers 120 is also the material forming the absorption layers 122. Thus, the absorption of the light emitted by the emission structure 102 is absorbed not only by the second emissive layers 118, but also by the absorption layers 122 present in the second barriers 120.

Moreover, the total thickness of the second quantum wells, that is to say the total thickness of the conversion structure 104 (dimension parallel to the Z axis of FIG. 2) is here greater than or equal to around 40 nm, which allows the conversion structure 104 to achieve good absorption of the light emitted by the emission structure 102 in order to carry out a conversion of the wavelength or wavelengths present in this light. In the particular embodiment described here, given the indium concentrations $X_1$ and $X_2$ mentioned previously, the LED 100 is configured for emitting green light thanks to the conversion of the blue light emitted by the emission structure 104 into green light by the conversion structure 104.

Advantageously, the thickness of the conversion structure 104 is greater than or equal to around 60 nm, or greater than or equal to around 100 nm, or even greater than or equal to around 200 nm, which further increases the absorption achieved by the conversion structure 104 vis-à-vis the light emitted by the emission structure 102 due to the fact that such a thickness implies the presence of a greater thickness of material absorbing the light emitted by the emission structure 102.

This high thickness of the conversion structure 104 is possible thanks to the presence of the GaN interlayers 124 which, during the production of the second barriers 120 by epitaxy, produce a relaxation of the lattice parameter and make it possible to obtain a total thickness of InGaN much greater than what would be possible to achieve in the absence of said GaN interlayers.

Moreover, in order that the InGaN of the absorption layers 122 and the second emissive layers 118 is good quality, the thickness of InGaN located between two successive interlayers 124 (that is to say the thickness of one of the absorption layers 122, or that of the second emissive layers 118 and the two adjacent absorption layers 122) is preferably less than around 9 nm. Furthermore, the thickness of each GaN interlayer 124 is for example between 1 and 4 atomic monolayers, and preferably between 1 and 2 atomic monolayers.

With the conversion structure 104 shown in FIG. 2, having a total thickness of 80 nm, and comprising two second $In_{0.25}Ga_{0.75}N$ emissive layers 118, GaN interlayers 124 (two on each side of each of the second emissive layers 118), and $In_{0.14}Ga_{0.86}N$ absorption layers 122 between which are arranged the interlayers 124, this can absorb around 80% of an incident flux of 100 W/cm². By producing a conversion structure 104 having a total thickness of 140 nm, and comprising two second $In_{0.25}Ga_{0.75}N$ emissive layers 118, GaN interlayers 124 (four on each side of each of the second emissive layers 118), and the $In_{0.14}Ga_{0.86}N$ absorption layers 122 between which are arranged the interlayers 124, this structure may absorb around 97% of an incident flux of 100 W/cm².

The conversion efficiencies obtained are for example between around 76% and 80% as a function of the incident flux.

Figure 3:
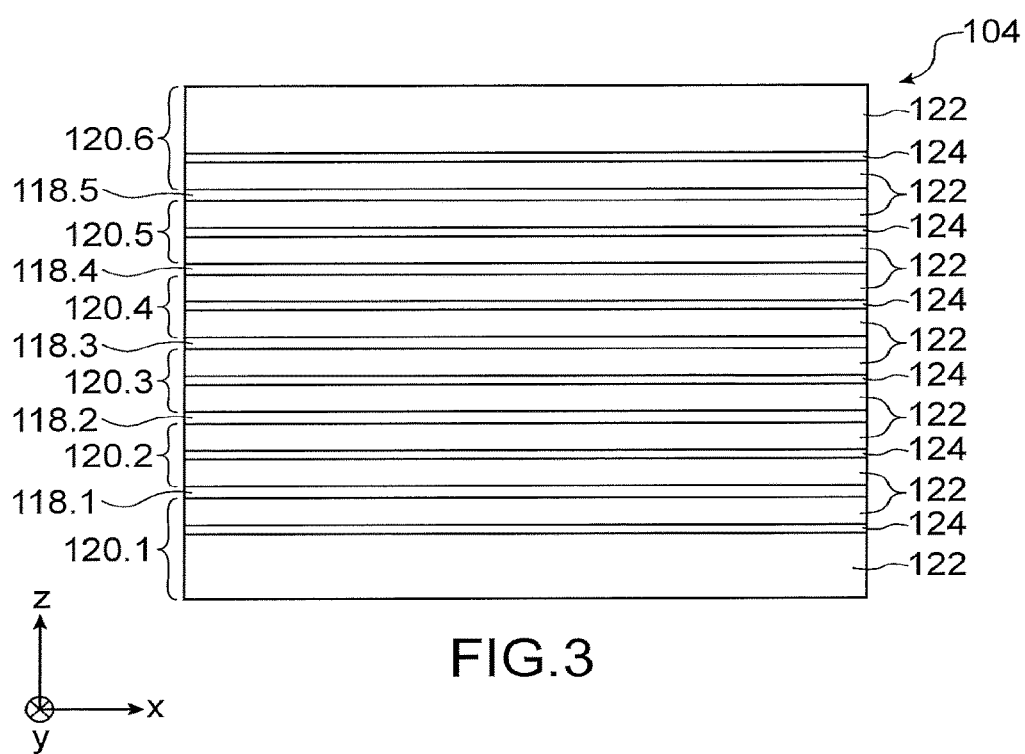

FIG. 3 shows a second exemplary embodiment of the conversion structure 104. In this second exemplary embodiment, each second barrier 120 comprises a single GaN interlayer 124. For a total thickness equivalent to that of the conversion structure 104 according to the first exemplary embodiment, the conversion structure 104 according to this second exemplary embodiment comprises a greater number of quantum wells, here five. The different alternatives described previously in relation with the first exemplary embodiment may also apply to this second exemplary embodiment.

According to an alternative embodiment, the conversion structure 104 may be polychromatic. Such a structure comprises, in addition to the second quantum well or wells which are configured for converting the light (comprising a first wavelength or a first range of wavelengths) emitted by the emission structure 102 into a light comprising a second wavelength or a second range of wavelengths, for example of green colour, one or more third quantum wells configured for converting the light emitted by the emission structure 102 into a light comprising a third wavelength or a third range of wavelengths, different to the second wavelength or the second range of wavelengths. This conversion difference between the quantum wells is obtained by producing the emissive layers of these wells with InGaN comprising different indium concentrations.

Such a polychromatic conversion structure 104 corresponds for example to a structure similar to that shown in FIG. 2, in which the indium concentration of the InGaN of the emissive layer 118.1 is different to that of the InGaN of the emissive layer 118.2. Thus, the emissive layer 118.1 and the barriers 120.1 and 120.2 may form a quantum well in which the $In_{X2}Ga_{1-X2}N$ of the emissive layer 118.1 is such that $X_2=0.25$ in order that this quantum well carries out a conversion to a wavelength of around 530 nm (green light), and the emissive layer 118.2 and the barriers 120.2 and 120.3 may form a quantum well in which the $In_{X4}Ga_{1-X4}N$ of the emissive layer 118.2 is such that $X_4=0.35$ in order that this quantum well carries out a conversion to a wavelength of around 620 nm (red light).

In an analogous manner, the conversion structure 104 shown in FIG. 3 may correspond to a polychromatic conversion structure, with in this case one or more of the quantum wells of this structure carrying out a conversion to a certain wavelength and the other quantum well(s) carrying out a conversion to another wavelength.

It is also possible that the conversion structure carried out a conversion of polychromic light according to more than two wavelengths, or more than two wavelength ranges, when said structure comprises more than two quantum wells.

In the exemplary embodiments and alternatives described above, the indium composition in the InGaN of the different layers is substantially constant within this or each of these layers. In an alternative, it is possible that the indium composition of one or several of the layers of the conversion structure 104 and/or of the emission structure 102 varies between two values, along the direction in which the different layers of the LED 100 are stacked (that is to say parallel to the Z axis). These variations are however such that the conditions mentioned previously on the indium concentrations $X_1$, $X_2$ and $X_3$ are always borne out, that is to say such that $0<X_1<X_2$ and $Eg(In_{X2}Ga_{1-X2}N)<Eg(In_{X3}Ga_{1-X3}N) \leq h \cdot c/\lambda_1$.

From the structure of the LED 100 as shown in FIG. 1, electrodes are next produced such that they are electrically connected to the first and second layers 106, 108.

The LED 100 described previously may be produced in the form of a planar diode, that is to say in the form of a stack of layers formed for example by epitaxy on a substrate, as shown in FIG. 1, the main faces of the different layers being arranged parallel to the plane of the substrate (parallel to the plane (X,Y)). In an alternative, the LED 100 may also be produced in the form of a nanowire, axial or radial, as described for example in the document WO 2014/154690 A1.

The invention claimed is:

1. A light emitting diode including at least:
   a structure for emitting light at at least one first wavelength $\lambda_1$, comprising a p-n junction in which is arranged an active zone including at least one first quantum well formed by a first emissive layer comprising $In_{X1}Ga_{1-X1}N$ arranged between two first barriers;
   a conversion structure configured for converting the light intended to be emitted by the emission structure into at least one second wavelength $\lambda_2$ different to the first wavelength $\lambda_1$, arranged on the emission structure and including at least one second quantum well formed by a second $In_{X2}Ga_{1-X2}N$ emissive layer, arranged between two second barriers each including several first $In_{X3}Ga_{1-X3}N$ absorption layers separated from each other by at least one first GaN interlayer;
   in which the indium concentrations $X_1$, $X_2$ and $X_3$ are such that $0<X_1<X_2$ and $Eg(In_{X2}Ga_{1-X2}N)<Eg(In_{X3}Ga_{1-X3}N) \leq h \cdot c/\lambda_1$,
   with:
   Eg corresponding to the gap, or to the forbidden energy gap;
   h corresponding to the Planck's constant equal to around $6.63 \cdot 10^{-34}$ J·s;
   c corresponding to the speed of light, equal to around 299,792,458 m/s.

2. The light emitting diode according to claim 1, in which the total thickness of the conversion structure is greater than or equal to 40 nm, or greater than or equal to 60 nm.

3. The light emitting diode according to claim 1, in which the indium concentrations $X_1$ and $X_3$ are such that $X_1<X_3$.

4. The light emitting diode according to claim 1, in which the conversion structure comprises a number of second quantum wells between 1 and 50.

5. The light emitting diode according to claim 1, in which each of the first barriers comprises a GaN layer.

6. The light emitting diode according to claim 1, in which the indium concentration $X_1$ is between around 0.09 and 0.18, and/or in which the indium concentration $X_2$ is such that $X_2 \geq 0.22$, and/or in which the indium concentration $X_3$ is such that $0.08 \leq X_3 \leq 0.22$.

7. The light emitting diode according to claim 1, in which each first absorption layer which is not arranged against the second emissive layer has a thickness less than 9 nm, and/or in which the total thickness of the second emissive layer (118) and of two first absorption layers (122) arranged against the second emissive layer (118) is less than 9 nm.

8. The light emitting diode according to claim 1, in which each first interlayer has a thickness between 1 and 4 atomic monolayers.

9. The light emitting diode according to claim 1, in which each of the second barriers comprises two first absorption layers and a first interlayer.

10. The light emitting diode according to claim 1, in which the conversion structure comprises at least one third quantum well formed by a third $In_{X4}Ga_{1-X4}N$ emissive layer, arranged between two third barriers each including several second $In_{X5}Ga_{1-X5}N$ absorption layers separated from each other by at least one second GaN interlayer, in which the indium concentrations $X_4$ and $X_5$ are such that $X_1 < X_4$ and $Eg(In_{X4}Ga_{1-X4}N) < Eg(In_{X5}Ga_{1-X5}N) \leq h \cdot c / \lambda_1$, with $X_2$ of value different to that of $X_4$.

11. The light emitting diode according to claim 10, in which the indium concentration $X_2$ is between 0.22 and 0.25, and in which the indium concentration $X_4$ is between 0.3 and 0.4.

12. A method for producing at least one light emitting diode, including at least:
   production of a structure for emitting light at at least one first wavelength $\lambda_1$, comprising a p-n junction in which is arranged an active zone including at least one first quantum well formed by a first emissive layer comprising $In_{X1}Ga_{1-X1}N$ arranged between two first barriers;
   production of a conversion structure configured for converting the light intended to be emitted by the emission structure into at least one second wavelength $\lambda_2$ different to the first wavelength $\lambda_1$, arranged on the emission structure and including at least one second quantum well formed by a second $In_{X2}Ga_{1-X2}N$ emissive layer, arranged between two second barriers each including several first $In_{X3}Ga_{1-X3}N$ absorption layers separated from each other by at least one first GaN interlayer;
   in which the indium concentrations $X_1$, $X_2$ and $X_3$ are such that $0 < X_1 < X_2$ and $Eg(In_{X2}Ga_{1-X2}N) < Eg(In_{X3}Ga_{1-X3}N) \leq h \cdot c / \lambda_1$,
with:
Eg corresponding to the gap, or to the forbidden energy gap;
h corresponding to the Planck's constant equal to around $6.63 \cdot 10^{-34}$ J·s;
c corresponding to the speed of light, equal to around 299,792,458 m/s.

13. The method according to claim 12, in which the layers of the emission structure and the conversion structure are produced by epitaxy.

* * * * *